(12) United States Patent
Shoemaker

(10) Patent No.: US 6,323,656 B2
(45) Date of Patent: Nov. 27, 2001

(54) WIRING HARNESS DIAGNOSTIC SYSTEM

(75) Inventor: Jim Milton Shoemaker, Horicon, WI (US)

(73) Assignee: Deere & Company, Moline, IL (US)

( * ) Notice: Subject to any disclaimer, the term of this patent is extended or adjusted under 35 U.S.C. 154(b) by 0 days.

(21) Appl. No.: 09/768,977

(22) Filed: Jan. 24, 2001

Related U.S. Application Data

(63) Continuation-in-part of application No. 09/240,115, filed on Jan. 29, 1999, now Pat. No. 6,222,374.

(51) Int. Cl.$^7$ .......................... H01H 31/02; G01R 31/00; B60Q 1/00; G01M 17/00
(52) U.S. Cl. .......................... 324/537; 324/503; 324/556; 340/459; 701/29
(58) Field of Search .................. 324/537, 380, 324/384, 503, 524, 382, 556; 701/31, 29, 34; 340/500, 459

(56) References Cited

U.S. PATENT DOCUMENTS

| | | | |
|---|---|---|---|
| 4,538,106 | 8/1985 | Anderson | 324/158 T |
| 5,017,910 | 5/1991 | Farber et al. | 340/635 |
| 5,347,224 | 9/1994 | Brokaw | 324/522 |
| 5,365,438 | * 11/1994 | Mitchell et al. | 364/424.03 |
| 5,640,093 | 6/1997 | Murray et al. | 324/379 |
| 6,134,488 | * 10/2000 | Sasaki et al. | 701/31 |

OTHER PUBLICATIONS

Patent Abstract of Japan 57163877, publication date Oct. 1982.

* cited by examiner

*Primary Examiner*—Glenn W. Brown
*Assistant Examiner*—Anjan K Deb

(57) ABSTRACT

A circuit includes a plurality of inexpensive resistors connected at one end to the open collector outputs of an output array of NPN output transistors which are connected to a wiring harness or the like for selectively powering a preselected load. The opposite ends of the resistors are connected to the base of an NPN sense transistor. The output NPN transistors, when in the on condition, are biased well into saturation for normal loads and therefore provide a very low Vce (sat) when properly connected through the harness to the intended load. In the off condition, the output NPN transistors look essentially like an open circuit. Vce (sat) is lower than the base turn-on voltage of the NPN sense transistor which has a grounded emitter. The collector of the NPN sense transistor is connected to a source of voltage through a pull-up resistor and to an input of the microprocessor which controls the signals to the output array transistors. The base of each output transistor is connected to an LED to provide a visual indication of which inputs are on and to help the technician locate an area on the circuit board or wiring harness corresponding to a particular function or load on the vehicle.

14 Claims, 1 Drawing Sheet

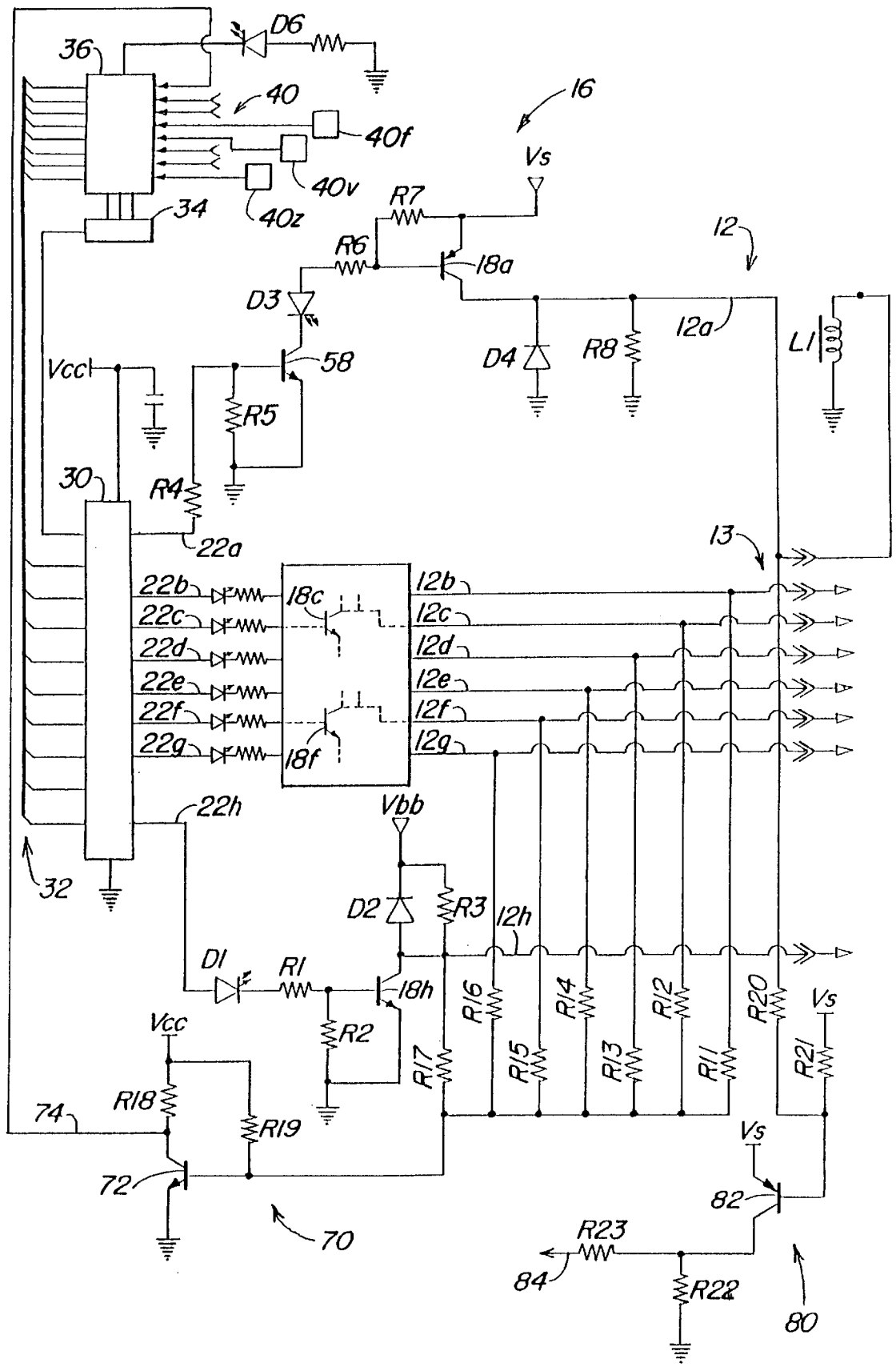

WIRING HARNESS DIAGNOSTIC SYSTEM

This application is a continuation of application Ser. No. 09/240,115 filed Jan. 29 1999, now U.S. Pat. No. 6,222,374.

BACKGROUND OF THE INVENTION

1) Field of the Invention

The present invention relates generally to fault detection systems, and, more specifically, to circuitry for detecting improperly connected or shorted wires in a wiring harness or the like.

2) Related Art

A typical vehicle has numerous solenoids, lamps and relays connected by a wiring harness to a vehicle controller. An incorrect voltage or incorrect load on a line can cause expensive damage to electrical and electronic components and may render the vehicle inoperable. During servicing of the vehicle or during manufacture of the harness, the connectors may by wired incorrectly so that battery voltage is applied directly to a semiconductor or the semiconductor is connected to a high current sink or ground resulting in damage to the controller or to other components in the circuit. For example, a high current pull-in coil for an engine enablement function such as the fuel pump drive sometimes is incorrectly wired to the output that is meant for a low-current hold-in coil. Fuses often are utilized in an attempt to protect the circuit, but each fuse must be durable enough for vehicle abuse and transients that occur during normal operation, and therefore the fuse may fail to open before a vital component in the circuit is damaged. Other protection methods include the use of individual series precision current sensing resistors, one at each output of the controller, with a series of operational amplifiers to provide a signal to the controller. Such circuits are relatively complex, costly and sensitive to variations in resistance. Other fault detection circuits utilize a test power supply having a voltage level well below the operating voltages to carry out a self-testing procedure and allow power up only if no low impedance paths are detected in the bus or harness. These circuits may require a special power supply and can also be costly and complex. Some circuits have a slow diagnostic time and cannot be used to provide checks during routine operation of the vehicle.

Diagnosing a system with numerous input and output lines is often tedious. Identifying a particular portion of a circuit on a circuit board or wiring harness connection can often require time-consuming references to a wiring diagram. As the number of input and output functions to and from a controller increases, the technician often finds that correlating the circuit diagram with a particular portion of the hardware is increasingly difficult.

BRIEF SUMMARY OF THE INVENTION

It is therefore an object of the present invention to provide an improved circuit for diagnosing wiring harnesses and similar components. It is a further object to provide such a circuit which overcomes most or all of the aforementioned problems.

It is a further object of the present invention to provide an improved circuit for diagnostic purposes which effectively detects wiring problems. It is another object to provide such a circuit which can detect faults quickly and which does not require special test voltages. It is still a further object to provide such a circuit which is sufficiently durable to operate reliably on a vehicle or other device wherein transients and over-voltage or under-voltage conditions occur relatively frequently.

It is another object of the present invention to provide an improved circuit for diagnosis of wiring harnesses or the like which is simple in construction and fast and reliable in operation. It is another object to provide such a circuit which does not require precision resistors or numerous operational amplifiers. It is a further object to provide such a circuit which can quickly and reliably check for over-voltages, wiring harness failures, and shorts to ground or to power line and protect electronic components before such faults cause permanent damage to the electronic system.

It is another object of the present invention to provide an improved circuit for on-the-go diagnosis of wiring harness connections or the like wherein the diagnosis takes place in a very short period of time without perceptible interruption of the normal operation of the vehicle or other device. It is yet another object to provide such a circuit wherein the circuit board as well as the wiring harness connected to the circuit board can be diagnosed. It is still another object of the invention to provide such a circuit which is relatively inexpensive and does not require precision resistors or a large number of operational amplifiers.

It is still another object of the invention to provide an improved diagnostic circuit which is relatively simple and inexpensive in construction and which facilitates easy identification of circuit functions and circuit faults without need for continual reference to a wiring diagram.

A circuit constructed according to the teachings of the present invention includes a plurality of inexpensive resistors connected at one end to the open collector outputs of an output array of NPN output transistors which are connected to a wiring harness or the like for selectively powering a preselected load. The opposite ends of the resistors are connected to the base of an NPN sense transistor. The output NPN transistors, when in the on condition, are biased well into saturation for normal loads and therefore provide a very low Vce (sat) when properly connected through the harness to the intended load. In the off condition, the output NPN transistors look essentially like an open circuit. Vce (sat) is lower than the base turn-on voltage of the NPN sense transistor which has a grounded emitter. The collector of the NPN sense transistor is connected to a source of voltage through a pull-up resistor and to an input of the microprocessor which controls the signals to the output array transistors.

To test the connections of the harness to the NPN output transistors, the microprocessor turns on all the output transistors simultaneously for a very short period of time, preferably only a few microseconds. If all the outputs are connected to the intended loads, the Vce of each of the transistors will be less than the base turn-on voltage of the sense transistor. If any of the outputs is improperly connected to the source voltage or to a high current sink, that transistor will come out of saturation and Vce will rise above the turn-on voltage of the sense transistor. The sense transistor then turns on to provide a signal to the microprocessor that a fault has been detected. During operation of the vehicle, the system continuously monitors for ground fault problems by turning on all outputs except one for a few microseconds. If the output that is not turned on is not shorted to ground, the voltage on that line will rise toward source voltage and turn on the sense transistor. Each output is checked in sequence. The microprocessor provides a fault code if a grounded condition is detected on a line or lines.

To provide diagnostics for a system wherein a positive turn-on voltage is necessary for enablement of the device connected through the harness, a similar detection arrangement is provided which utilizes the low Vce of a PNP output transistor in saturation. To aid in the diagnostics, each output transistor in the output array includes a base connected in series with an input LED so the technician can tell at a glance which inputs to the array are on and which inputs to the array are off. The technician therefore can determine which connections on the output array corresponds to a particular input or output function on the vehicle and if the output transistor on the array for that function is operating properly by simply activating that function while looking at the LED outputs. For example, by bouncing on the seat, the LED for the operator presence circuit will flash to tell the technician which line corresponds to that function. If no LED flashes when a particular function input or output is activated, the technician knows to look for problems in that portion of the system. The one-to-one correspondence significantly simplifies system troubleshooting and reduces the amount of time the technician has to refer to the wiring schematic.

These and other objects, features and advantages of the present invention will become apparent to one skilled in the art upon reading the following detailed description in view of the drawings.

BRIEF DESCRIPTION OF THE DRAWING

The single drawing FIGURE is a schematic of a diagnostic circuit connected to the output terminals of a output buffer array.

DETAILED DESCRIPTION OF THE DRAWING

Referring now to the single drawing FIGURE, therein is shown a schematic for a portion of a vehicle circuit 10 including a cable harness or similar multiple line element indicated generally at 12 and including a plurality of output lines 12a–12k connected through line connectors 13 to various loads such as solenoids, relays, and indicator lamps (not shown) on the vehicle including those for fuel pump operation and for interlock functions such as operator presence and parking brake operation. The lines 12a–12k are connected to output terminals of an output buffer array 16 on a main control board. As shown, the buffer array 16 includes a plurality of power output transistors 18a–18k, one for each of the output lines 12a–12k. Detailed output buffer circuits are shown only for the first (18a) and last (18h) transistor of one array 16, with the first power output transistor 18a being a PNP transistor for high side switching to connect the load such as a fuel pump solenoid or other engine enable function on line 12a to source voltage of nominally twelve volts. The remaining transistors 18b–18h (only the circuit for 18h is shown since the circuits for transistors 18b–18g are identical) are NPN transistors for switching solenoids, relays and indicator lamps on lines 12b–12h to ground. It is to be understood that the number of arrays 16 and the combinations of PNP and NPN output transistors 18 can be varied to accommodate different numbers of lines 12 and the switching polarity necessary for the loads connected to those lines.

The output buffer array 16 includes inputs 22a–22h connected to the corresponding outputs of parallel latch circuit 30 which in turn is connected through an eight bit output bus 32 to a conventional chip output selector 34 and microcontroller 36. The microcontroller 36 sequentially polls various inputs and outputs including voltage levels 40v, fault detector circuit outputs 40f, and interlock switches 40z on the vehicle via terminals 40 and reads in these inputs and outputs eight at a time. Control signals are provided via bus 32 to the latch circuit 30 which maintains preselected output states depending on the signals received from the microcontroller 36. Each of the outputs 22a–22g selectively provides base drive current for the NPN output transistors 18b–18h through a light emitting diode D1 connected in series with a base current limiting resistor R1. A resistor R2 is connected between the base of each NPN output transistor and ground. The base resistors assure that stray currents do not bias the transistor on.

A pull-up resistor R3 is connected between a fused voltage source (Vbb) and the collector to pull up the voltage at the outputs for board self-diagnostic purposes when no external output lines 12 are connected to the board. A snubber diode D2 is connected to the collector of each of the transistors 18b–18h and the voltage source Vbb for protection since many of the loads on the lines 12, such as the solenoids and relays, are inductive.

A grounded emitter inverting transistor 58 includes a base connected by a current limiting resistor R4 to the latch terminal 22a and to ground by resistor R5. The collector of the transistor 58 is connected by a light emitting diode D3 and resistor R6 to the base of the PNP output transistor 18a which has an emitter connected to the voltage source (Vs). A resistor R7 is connected between the voltage source Vs and the base to assure that the transistor is not biased on by stray currents. A snubber diode D4 is connected in parallel with a resistor R8 between ground and the collector of the PNP transistor 18a. The resistor R8 pulls the output on the line 12a low when the line is disconnected from its load, which as shown is a hold-in solenoid L1 on a fuel pump control (or other engine enablement device).

When the latch terminal 22a goes high, the transistors 58 and 18a are turned on, and D3 provides a visual indication that the fuel solenoid signal is present and the line 12a should be on (near the Vs voltage level). When any of the terminals 22b–22h goes high, the corresponding one of the transistors 18b–18h is turned on to ground the corresponding one of the output lines 12b–12h. A visual turn-on signal is provided by the diode D1 for that output transistor. An LED indication can also be provided in the circuitry connected to the terminals 40 of the microcontroller 36 so a technician can tell at a glance which inputs are on as well as which output lines 12a–12h are to be in the on condition.

A fault detection circuit indicated generally at 70 is connected to the outputs 12b–12g of the NPN output transistors 18b–18h by voltage dropping resistors R11–R17, respectively. The circuit 70 includes an NPN transistor 72 having a grounded emitter and a collector output 74. The collector is connected through a resistor R18 to a voltage source Vcc having a nominal voltage of approximately five volts so that when the transistor 72 is off, the output 74 will be high (approximately +5 volts). The base of the transistor 72 is connected via resistors R11–R17 to the output lines 12a–12h. When all of the NPN output transistors 18b–18h are turned on and are in saturation, the Vce(sat) of the transistors will be very low and on the order of 0.1 to 0.2 volts so that the voltage at the base of the transistor 72 will be below about half a volt and below the base-emitter turn on voltage of the transistor 72. If some of the transistors 18b–18h are turned off and some are on (as is the case when the vehicle is in operation) or if one or more of the output transistors is not in saturation, the voltage at the base of the transistor 72 will rise above the turn-on voltage, causing the output 74 to go low (approximately 0.1 volt). A pull-up resistor R19 is connected between Vcc and the base of the transistor 72 to make the circuit 70 more sensitive to the condition where an NPN output transistor is not in saturation. Since the transistors 18b–18h normally are in saturation when turned on and properly connected to the load on the lines 12b–12g, momentarily switching all the NPN transistors in the output array 16 to the on condition should cause the output 74 to go high (the voltage at the base of the transistor 72 will drop below turn-on as all of the NPN transistors go into saturation) unless there is a fault such as an improper load, a burned out NPN transistors in the array 16, or a short to the voltage source in one of the lines 12.

The output 74 of the transistor 72 is connected to the input circuitry for the microcontroller 40 which senses whether the high or low condition exists on the output. If the condition at 74 is wrong for the given inputs to the array 16, the microcontroller can shut down all outputs and provide a warning until the fault is corrected. By turning on all the NPN outputs 12b–12h except one for a short period, preferably less than 50 microseconds for a resistive load and several hundred microseconds for an inductive load, that single output line can be checked. The single off line should rise toward supply voltage and cause the voltage at the base of the transistor 72 to rise above the turn-on voltage of the transistor which results in a low level at 74. If the low level is detected for the particular line being tested, the microcontroller advances the sequence to test the next one of the lines 12. However, if at any time there is a discontinuity between the load and the line being tested or if that line is shorted to ground, the voltage on that line will not rise sufficiently to turn on the transistor 72, and the microcontroller will provide a fault indication and shut down the outputs. The test time period is so short for each line that the normal operation of the vehicle is not hindered during the sequencing if no faults are detected. Therefore, ground fault tests of the outputs can be conducted at regular intervals during vehicle operation. For example, by testing one output each 50 milliseconds, all the outputs can be checked for shorts in less than a second. The microcontroller 36 can shut down operation immediately to avoid costly and time consuming component damage.

A circuit 80 similar to the circuit 70 is connected to the PNP output transistor line 12a. A PNP transistor 82 includes an emitter connected to source voltage Vs and a base connected to the line 12a by a resistor R20. The base is also connected by a pull-up resistor R21. When the PNP output transistor 18a is off, the voltage at the base of the PNP transistor 82 drops causing the transistor to turn on and the level at output 84 to go to the high condition. If the transistor 18a is on and in saturation which it should be under normal loading, the voltage on the line 12a will rise toward the source voltage Vs and cause the transistor 82 to turn off which, in turn, causes the output 84 to go to the low condition. However, if the line 12a is improperly connected to ground or improperly connected to a high current draw component (such as the pull-in coil for the fuel solenoid, rather than the much lower current hold-in coil), the transistor 18a will not go into saturation and line voltage will not be sufficient to turn off the transistor 82. The output 84 will remain in the high condition. A pull-down resistor 22 is connected to the collector of the transistor 82 to assure the output 84 is low when the transistor 82 is off. A resistor R23 is connected between the collector and the output 84 to limit output current and reduce the high condition voltage level for compatibility with the input selection circuitry for the microcontroller 36 which preferably operates at a voltage much lower than Vs to keep the controller board from resetting, even at extremely low voltages during cold starting of the vehicle. The microcontroller 36 checks the condition at 84, and if the high condition is found when the transistor 18a is turned on, a fault is indicated and the outputs are shut down. By using a separate circuit 80 for the PNP output transistor 18a, sensitivity to a fault can be increased and the fuel pump solenoid L1 or other positive switching engine enabling load can be checked more frequently than the loads on the remaining lines 12b–12h. An indicator diode (D6) is connected to the microcontroller 36 and provides a heartbeat signal during operation as well as a coded signal to provide a visual identification of a fault when one is detected.

At power up of the vehicle, the circuit 10 is first checked for major wiring errors such as Vs connected to one of the lines 12b–12h or line 12a grounded or connected to a high amperage coil rather than to the lower amperage coil L1. All the outputs of the array 16 are turned off, and the microcontroller checks for a low at the output 74 and a high at the output 84 (the solenoid coils and other external wiring on lines 12 or the resistors R3 and R8 biasing the transistors 72 and 82 into the on conditions). If the conditions are not satisfied indicating a fault, the fault flag is set and start-up is aborted. If the first tests are successful, the NPN outputs 12b–12h are all turned on and the output transistors 18 should all go into saturation to turn off the sense transistor 72 and provide a high condition at 74 unless an NPN transistor is burned out or Vs is improperly connected or shorted to one of the outputs 12b–12h. The PNP output transistor 18a is also turned on which should result in the transistor 82 being off and the output 84 being low, unless the line 12a is improperly connected to a high current load such as a pull-in coil or to ground. If the preceding tests indicate no faults, the microcontroller initiates the normal program start for the vehicle. If not, the fault flag is set, the routine is aborted, and vehicle operation is locked out. The microcontroller flashes the particular code or codes associated with the particular faults detected on the light emitting diode D6.

During operation of the machine, the outputs 12b–12h are tested every 50 milliseconds for a short to ground by briefly turning on only one output line at a time and checking for the low condition at 74 as described above. Also, the outputs 12b–12h are checked regularly by briefly turning on all the NPN output transistors 18b–18h except one and checking to see if the output 74 is low. If 74 is not low, the particular output line for the transistor that is off probably is shorted to ground. The PNP transistor output 12a is also checked as set forth above, preferably more frequently than the NPN outputs. If a particular test is not successful, the fault flag is set, a fault code is flashed out on D6.

By way of example only, the following component values are suggested:

| | |
|---|---|
| R1, R6 | 220 ohms |
| R2–R5, R7, R8 | 10k ohms |
| R11–R20 | 10k ohms |
| R21 | 1.2k ohms |
| R22, R23 | 10k ohms |

Having described the preferred embodiment, it will become apparent that various modifications can be made without departing from the scope of the invention as defined in the accompanying claims.

What is claimed is:

1. A detection circuit for an electrical system on a vehicle, the vehicle having input structure monitoring a plurality of conditions on the vehicle during start-up and operation of the vehicle, the detection circuit including:

output lines connected to a plurality of electrical loads;

a controllable drive circuit connected to the output lines for selectively providing drive of preselected amplitudes to the electrical loads;

a sensing circuit connected to the output lines and providing an output signal responsive to presence and absence of the drives of preselected amplitudes to the loads during the start-up and operation of the vehicle;

a controller connected to the drive circuit and selectively controlling the drive to the electrical loads, the controller also connected to the input structure and to the sensing circuit and providing a preselected response to the conditions on the vehicle and the output signal; and a readout device connected to the controller and providing an error signal when the controller response fails to correspond to the preselected response.

2. The detection circuit as set forth in claim 1 further comprising indicators connected between the controller and the drive circuit and providing an indication of the output lines over which drives are to be provided, the indicators facilitating visual correlation of the conditions to be monitored with the output lines.

3. The detection circuit as set forth in claim 1 wherein the input structure includes vehicle interlock circuit connections.

4. The detection circuit as set forth in claim 1 wherein the readout device comprises a light emitting diode connected to the controller, and wherein the error signal comprises a coded flashing signal indicating the source of the error signal.

5. The detection circuit as set forth in claim 4 wherein the light emitting diode also provides a heartbeat signal to provide a visual indication of controller operation.

6. The detection circuit set forth in claim 2 wherein the drive circuit includes a plurality of drive transistors having base inputs, and the indicators comprise light emitting diodes connected to the controller and to the base inputs.

7. The detection circuit as set forth in claim 6 wherein the transistors include collectors connected to the sensing circuit, and wherein the sensing circuit senses transistor saturation.

8. The detection circuit as set forth in claim 2 wherein the input structure includes a line from an operator presence circuit and wherein the indicators include an operator presence indicator to provide a circuit locator indication for an operator presence function.

9. A method of providing an error indication to an operator of a vehicle, the vehicle having a plurality of electrical load devices for controlling operations of the vehicle, a controller with controller input device receiving signals from input devices on the vehicle including an input for connection to an interlock circuit responsive to conditions on the vehicle, and a driver having output terminals providing control outputs, the output terminals connected by wiring structure to the controller and to the electrical load devices, the method including the steps of:

activating the driver with the controller in accordance with preselected conditions on the vehicle;

monitoring output signals from the output terminals;

comparing the monitored output signals from the output terminals with a desired response including a desired amplitude of the control outputs for preselected conditions on the vehicle;

preventing operation of the vehicle if the monitored output signals deviate from the desired response; and providing an indication to the operator of the fault which is preventing operation of the vehicle so the operator can determine immediately the conditions causing the prevention of operation.

10. The method as set forth in claim 9 wherein the step of providing an indication to the operator comprises connecting a light emitting diode device to the controller and activating the light emitting diode device according to the detected fault that is preventing operation.

11. A method of providing an error indication to an operator of a vehicle, the vehicle having a plurality of electrical load devices for controlling operations of the vehicle, a controller with controller input device receiving signals from input devices on the vehicle including an input for connection to an interlock circuit responsive to conditions on the vehicle, and a driver having output terminals providing control outputs, the output terminals connected by wiring structure to the controller and to the electrical load devices, the method including the steps of:

activating the driver with the controller in accordance with preselected conditions on the vehicle during start-up and operation of the vehicle;

monitoring output signals from the output terminals;

comparing the monitored output signals from the output terminals with a desired response for preselected conditions on the vehicle during the start-up and operation;

preventing operation of the vehicle if the monitored output signals deviate from the desired response;

providing an indication to the operator of the fault which is preventing operation of the vehicle so the operator can determine immediately the conditions causing the prevention of operation; and further comprising the step of identifying portions of the controller and the driver associated with conditions to which the interlock circuit is responsive without need for a circuit diagram by inserting a signal device between the controller and driver, and activating the signal device by changing a particular condition of the interlock circuit.

12. The method as set forth in claim 11 wherein the changing of a particular condition of the interlock circuit includes operating an operator presence interlock.

13. The method as set forth in claim 11 wherein the step of inserting a signal device comprises connecting a light emitting diode between the controller and the driver.

14. The method as set forth in claim 9 wherein the step of monitoring output signals from the output terminals include determining if output transistors connected to the output terminals are in saturation or out of saturation.

* * * * *